United States Patent
Sourani

(10) Patent No.: US 10,228,555 B2
(45) Date of Patent: Mar. 12, 2019

(54) RESONANCE MEMS MIRROR CONTROL SYSTEM

(71) Applicant: STMicroelectronics Ltd, Netanya (IL)

(72) Inventor: Sason Sourani, Hod Hasharon (IL)

(73) Assignee: STMicroelectronics Ltd, Netanya (IL)

( * ) Notice: Subject to any disclaimer, the term of this patent is extended or adjusted under 35 U.S.C. 154(b) by 0 days.

(21) Appl. No.: 15/256,909

(22) Filed: Sep. 6, 2016

(65) Prior Publication Data
US 2018/0067303 A1 Mar. 8, 2018

(51) Int. Cl.
| B81B 7/00 | (2006.01) |
| G02B 26/08 | (2006.01) |
| G09G 3/34 | (2006.01) |
| H02P 25/032 | (2016.01) |

(52) U.S. Cl.
CPC ......... *G02B 26/0841* (2013.01); *G09G 3/346* (2013.01); *H02P 25/032* (2016.02); *B81B 2201/042* (2013.01); *B81B 2203/0136* (2013.01)

(58) Field of Classification Search
CPC ............... G01D 5/24; B81B 2201/033; B81B 2201/034; B81B 2201/042; B81B 2203/0109; B81B 2203/0181; B81B 2203/058; B81B 3/0043; B81B 7/00; B81B 7/008; G01L 9/0072; G01L 19/00; G01L 1/144; G01P 15/125
USPC ........................................................ 318/114
See application file for complete search history.

(56) References Cited

U.S. PATENT DOCUMENTS

| 5,959,760 | A | 9/1999 | Yamada et al. | |
| 6,543,286 | B2* | 4/2003 | Garverick | G02B 6/266 73/514.18 |
| 6,614,954 | B2* | 9/2003 | Huang | G02B 6/3512 385/17 |
| 6,812,669 | B2* | 11/2004 | Hagen | G02B 26/0841 318/599 |
| 6,956,350 | B2* | 10/2005 | Hagen | G02B 26/0841 318/599 |
| 6,961,257 | B2* | 11/2005 | Garverick | G02B 6/266 365/49.1 |
| 7,088,070 | B2* | 8/2006 | Hagen | G02B 26/0841 318/599 |
| 7,670,015 | B2* | 3/2010 | Ide | G02B 6/3588 359/604 |

(Continued)

FOREIGN PATENT DOCUMENTS

WO WO-2016050176 A1 4/2016

OTHER PUBLICATIONS

EPO Search Report and Written Opinion for co-pending EP Appl. No. 17162674.0 dated Oct. 10, 2017 (9 pages).

*Primary Examiner* — Rina Duda
(74) *Attorney, Agent, or Firm* — Crowe & Dunlevy

(57) ABSTRACT

The present disclosure provides a system and method for controlling operation of a resonance MEMS mirror. The system and method includes activating either an in-plane or staggered MEMS mirror via sets of activation pulses applied to the MEMS mirror, detecting current at the MEMS mirror, generating a window for detecting a change in a direction of the current at the MEMS mirror, and terminating the window and the activation pulse if a change in the current direction is detected during the window. In some embodiments, two sets of activation pulses are applied to the MEMS mirror.

29 Claims, 9 Drawing Sheets

(56) References Cited

U.S. PATENT DOCUMENTS

| | | | | |
|---|---|---|---|---|
| 8,002,414 B2* | 8/2011 | Kobori | G03B 21/28 | 353/52 |
| 8,083,361 B2* | 12/2011 | Ide | G02B 6/3588 | 359/224.1 |
| 8,164,588 B2* | 4/2012 | Lauxtermann | G09G 3/3433 | 345/214 |
| 8,210,687 B2* | 7/2012 | Kobori | G03B 21/28 | 353/52 |
| 8,237,851 B2* | 8/2012 | Ngo | G03B 13/36 | 324/658 |
| 8,436,936 B2* | 5/2013 | Ngo | G03B 13/36 | 324/658 |
| 8,553,308 B2* | 10/2013 | Goren | G02B 26/0841 | 359/224.1 |
| 8,861,062 B2* | 10/2014 | Sourani | G02B 26/0841 | 310/309 |
| 2002/0101769 A1* | 8/2002 | Garverick | G02B 6/266 | 365/200 |
| 2003/0077026 A1* | 4/2003 | Huang | G02B 6/3512 | 385/18 |
| 2003/0174376 A1* | 9/2003 | Sane | G02B 26/0841 | 359/237 |
| 2003/0230997 A1* | 12/2003 | Hagen | G02B 26/0841 | 318/599 |
| 2004/0051033 A1* | 3/2004 | Hagen | G02B 26/0833 | 250/234 |
| 2004/0174757 A1* | 9/2004 | Garverick | G02B 6/266 | 365/200 |
| 2005/0047711 A1* | 3/2005 | Ide | G02B 6/3588 | 385/18 |
| 2005/0077860 A1* | 4/2005 | Hagen | G02B 26/0841 | 318/629 |
| 2005/0194922 A1* | 9/2005 | Hagen | G02B 26/0841 | 318/599 |
| 2008/0013143 A1* | 1/2008 | Ide | G02B 6/3588 | 359/223.1 |
| 2009/0059179 A1* | 3/2009 | Kobori | G03B 21/28 | 353/52 |
| 2009/0289606 A1* | 11/2009 | Lauxtermann | G09G 3/3433 | 320/166 |
| 2010/0103493 A1* | 4/2010 | Ide | G02B 6/3588 | 359/223.1 |
| 2011/0001832 A1* | 1/2011 | Ngo | G03B 13/36 | 348/187 |
| 2011/0080533 A1* | 4/2011 | Champion | H04N 9/3129 | 348/744 |
| 2011/0109951 A1* | 5/2011 | Goren | G02B 26/0841 | 359/213.1 |
| 2011/0273629 A1* | 11/2011 | Kobori | G03B 21/28 | 348/744 |
| 2012/0206785 A1* | 8/2012 | Sourani | G02B 26/0841 | 359/221.3 |
| 2012/0274787 A1* | 11/2012 | Ngo | G03B 13/36 | 348/187 |
| 2014/0125873 A1* | 5/2014 | Nakamura | H04N 9/3135 | 348/771 |
| 2014/0218700 A1 | 8/2014 | Naftali et al. | | |
| 2015/0161926 A1* | 6/2015 | Ogi | H04N 9/3129 | 345/207 |
| 2015/0185051 A1 | 7/2015 | Tsai | | |
| 2015/0227158 A1* | 8/2015 | Sako | G05F 1/561 | 323/313 |
| 2015/0276790 A1* | 10/2015 | Yonezawa | G01P 15/18 | 73/514.32 |
| 2015/0276853 A1* | 10/2015 | Murashima | G01R 31/28 | 324/537 |
| 2016/0205838 P1* | 7/2016 | Byrne | | |
| 2016/0305997 A1* | 10/2016 | Wiesbauer | G01L 9/0072 | |
| 2017/0023429 A1* | 1/2017 | Straeussnigg | H03M 3/336 | |
| 2017/0118452 A1* | 4/2017 | Ogi | G02B 26/0833 | |

* cited by examiner

RESONANCE MEMS MIRROR CONTROL SYSTEM

FIELD OF THE INVENTION

The present disclosure generally relates to Micro Electro Mechanical Systems ("MEMS") mirrors and, more particularly, to a control system for resonance MEMS mirrors.

BACKGROUND

Certain devices such as wafer defect scanners, laser printers, document scanners, projectors and the like make use of a narrow collimated laser beam that usually scans across a flat surface along a straight line path. A typical optical scanning system for this purpose employs a tilting flat mirror to deflect the beam. The tilting micro-mirror serves as a central element in many Micro Electro Mechanical Systems ("MEMS") devices and/or Micro Opto Electro Mechanical Systems ("MOEMS") devices. For the sake of convenience, these devices (i.e. MEMS and/or MOEMS) will be referred to herein as "MEMS" devices.

Many of these MEMS devices comprise two types of electro-static mirrors: in-plane mirrors and staggered mirrors. In-plane mirrors are usually driven at a resonance frequency. The stator and the rotor of in-plane mirrors are fabricated on a single layer, and the mirror's driving pulse is usually of a rectangular type signal. Staggered mirrors are typically comprised of two different layers: one that includes the stator and a second that includes the rotor. In some embodiments, however, such as where the stator or the rotor is tilted permanently after manufacturing, a single layer may be used for both the stator and the rotor. The staggered mirrors may operate at their resonance frequency or at lower frequencies down to, and including, DC.

Traditional driving control circuitry for MEMS mirror devices requires complex processing and use of A/D converters, amplifiers, and filters for monitoring the mirror. Moreover, changing the laser light power causes a change in mirror resonance frequency that traditional control algorithms are slow to detect and accommodate. Therefore, a need exists for a simplified control system that addresses the deficiencies of traditional MEMS mirror driving control circuitry.

SUMMARY

The present disclosure provides a control circuit for controlling operation of a resonance MEMS mirror, the control circuit comprising: timing circuitry configured to control timing of activation pulses for operating the MEMS mirror; amplifier circuitry configured to receive a first control signal from the timing circuitry and, responsive thereto, to generate a first set of activation pulses for operating the MEMS mirror; and a detection circuit configured to detect current at the MEMS mirror and to generate a reset signal in response to detecting a change in the direction of the current at the MEMS mirror; wherein the timing circuitry is further configured to terminate an activation pulse in response to receiving the reset signal from the detection circuit.

In another embodiment, the present disclosure provides a method for controlling operation of a resonance MEMS mirror, the method comprising: generating a first set of activation pulses for operating the MEMS mirror; generating a window for current detection, the window overlapping with an end of an activation pulse; detecting current at the MEMS mirror during the window; and terminating the activation pulse in response to detecting a change in current direction during the window.

The foregoing and other features and advantages of the present disclosure will become further apparent from the following detailed description of the embodiments, read in conjunction with the accompanying drawings. The detailed description and drawings are merely illustrative of the disclosure, rather than limiting the scope of the invention as defined by the appended claims and equivalents thereof.

BRIEF DESCRIPTION OF DRAWINGS

Embodiments are illustrated by way of example in the accompanying figures not necessarily drawn to scale, in which like numbers indicate similar parts, and in which.

DETAILED DESCRIPTION OF THE EMBODIMENTS

In the following detailed description and the attached drawings, numerous specific details are set forth to provide a thorough understanding of the present disclosure. Those skilled in the art will appreciate, however, that the present disclosure may be practiced, in some instances, without such specific details. In other instances, well-known elements have been illustrated in schematic or block diagram form in order not to obscure the present disclosure in unnecessary detail. Additionally, for the most part, specific details, and the like, have been omitted inasmuch as such details are not considered necessary to obtain a complete understanding of the present disclosure, and are considered to be within the understanding of persons of ordinary skill in the relevant art.

It is further noted that, unless indicated otherwise, all functions described herein may be performed in hardware or as software instructions for enabling a computer or other electronic device to perform predetermined operations, where the software instructions are embodied on a computer readable storage medium, such as RAM, a hard drive, flash memory or other type of computer readable storage medium known to a person of ordinary skill in the art. In certain embodiments, the predetermined operations of the computer, radio or other device are performed by a processor such as a computer or an electronic data processor in accordance with code such as computer program code, software, firmware, and, in some embodiments, integrated circuitry that is coded to perform such functions. Furthermore, it should be understood that various operations described herein as being performed by a user may be operations manually performed by the user, or may be automated processes performed either with or without instruction provided by the user.

The present disclosure provides a system and method for controlling a resonance MEMS mirror. When compared to conventional resonance MEMS mirror controllers, the disclosed control system provides a more efficient, simplified design that reduces required circuitry and increases operational speed.

Figure 1:
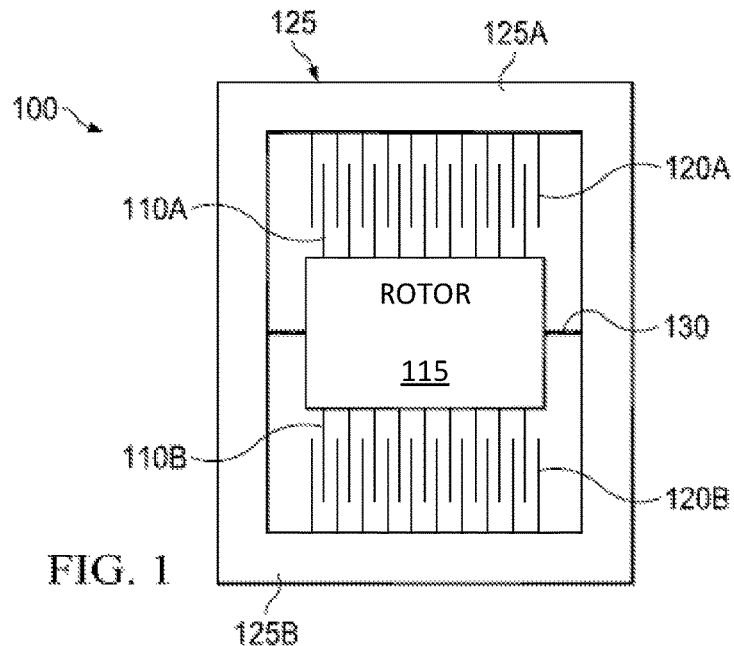
FIG. 1 illustrates a schematic example of an embodiment of a MEMS mirror apparatus.

Referring now to FIG. 1, a schematic example of a MEMS mirror 100 is shown. The MEMS mirror 100 comprises a tilting mirror (rotor) 115 having rotor fingers 110 connected thereto, a MEMS structure (stator) 125 having stator fingers 120 connected thereto, and a torsion spring 130 that enables the rotor 115 to move. The MEMS mirror 100 may be fabricated in two different varieties: (i) an in-plane design where the rotor 115 and stator 125 reside in the same plane, and (ii) a staggered design where the rotor 115 and stator 125 reside on different planes.

The stator 125 includes a first group of stator fingers 120A located on a first portion 125A of the stator 125, and a second group of stator fingers 120B located on a second portion 125B of the stator 125, wherein the first portion 125A of the stator 125 is opposite the second portion 125B of the stator 125. It should be understood that the first and second stator portions 125A and 125B discussed herein may comprise a single stator structure or, alternately, may comprise two separate stator structures. The groups of stator fingers are referenced by number 120 when referred to collectively, and by the respective number 120A or 120B when referenced separately.

Similarly, the rotor 115 includes a first group of rotor fingers 110A located on a first side of the rotor 115 and a second group of rotor fingers 110B located a second side of the rotor 115 opposite the first side. These groups of rotor fingers are referenced by number 110 when referred to collectively, and by the respective number 110A or 110B when referenced separately.

In the view provided in FIG. 1, the rotor 115 is positioned such that the first group of rotor fingers 110A is interdigitated with the first group of stator fingers 120A such that a capacitance exists between the first group of rotor fingers 110A and the first group of stator fingers 120A. Similarly, the second group of rotor fingers 110B is interdigitated with the second group of stator fingers 120B such that a capacitance exists between the second group of rotor fingers 110B and the second group of stator fingers 120B. It should be understood that, in the embodiments provided herein, the rotor fingers 110 and stator fingers 120 are considered interdigitated regardless of the angle of rotor 115.

In some embodiments, the first set of rotor fingers 110A may be interdigitated with either the first or second sets of stator fingers 120A/120B depending on the orientation of the rotor 115. Similarly, the second set of rotor fingers 110B may be interdigitated with either the first or second sets of stator fingers 120A/120B depending on the orientation of the rotor 115. In such embodiments, a capacitance may be achieved between the respective interdigitated sets of rotor fingers 110 and stator fingers 120.

A MEMS structure, such as that shown in FIG. 1, can resonate in its natural frequency, which can be represented in accordance with the following equation:

$$f_r = \frac{1}{2\pi}\sqrt{\frac{k}{j}}$$

where $f_r$ is the resonance frequency in Hz, k is the total torsion spring constant in N×m, and j is the rotor moment of inertia in kg×m².

The MEMS mirror 100 represents an embodiment that is activated by electrostatic force. Accordingly, the mirror 100 implements a design, wherein the first group of stator fingers 120A are interdigitated with the first group of rotor fingers 110A, and the second group of stator fingers 120B are interdigitated with the second group of rotor fingers 110B. This design increases the capacitance between the rotor 115 and the stator 125, which increases the electrostatic force generated when applying a voltage between the rotor 115 and stator 125.

Figure 2:
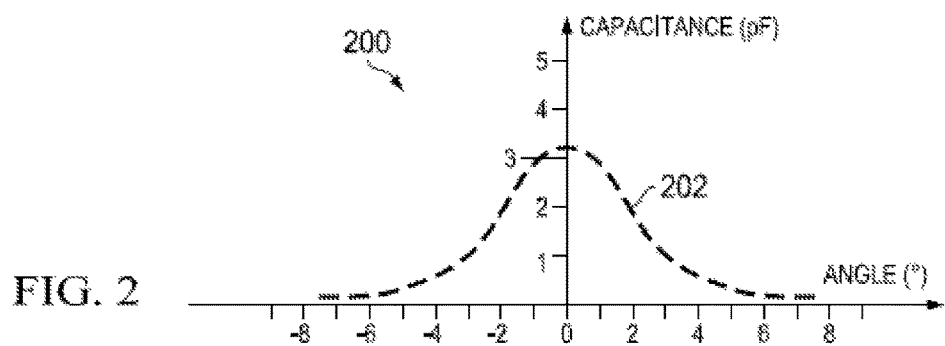
FIG. 2 illustrates a graph of capacitance vs. mirror angle characteristics for an in-plane MEMS mirror embodiment.

As mentioned above, the MEMS mirror 100 may be fabricated in two different varieties: (i) an in-plane design where the rotor 115 and stator 125 reside in the same plane, and (ii) a staggered design where the rotor 115 and stator 125 reside on different planes. FIG. 2 illustrates a graph 200 of capacitance vs. mirror angle characteristics for the mirror 100 when fabricated as an in-plane MEMS mirror. In this embodiment, line 202 represents the capacitance vs. mirror angle characteristics for the stator 125. As shown in FIG. 2, the greatest capacitance reading is achieved when the rotor 115 is at angle zero, which places the rotor fingers 110 in-plane with the stator fingers 120.

Figure 3:
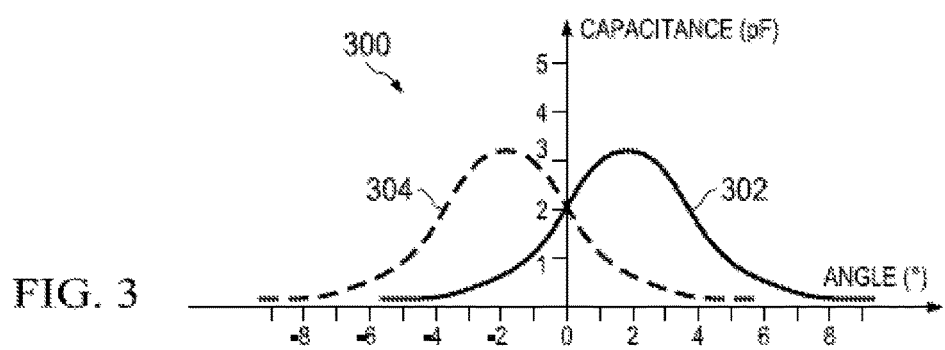
FIG. 3 illustrates a graph of capacitance vs. mirror angle characteristics for a staggered MEMS mirror embodiment.

FIG. 3 illustrates a graph 300 of the capacitance vs. mirror angle characteristics for the MEMS mirror 100 when fabricated as a staggered MEMS mirror. That is, wherein the stator 125 and rotor 115 are fabricated on different planes. In this embodiment, line 302 represents the capacitance vs. mirror angle characteristics for one portion of the stator (e.g., stator fingers 120A and first portion 125A), and line 304 represents the capacitance vs. mirror angle characteristics for another portion of the stator (e.g., stator fingers 120B and second portion 125B). As shown in FIG. 3, the greatest capacitance reading is not when the rotor 115 is at angle zero, but is instead at two different angles: a negative angle that achieves the greatest capacitance reading for the first set of stator fingers 120A and first portion 125A, and a positive angle that achieves the greatest capacitance reading for the second set of stator fingers 120B and second portion 125B (or vice-versa).

Referring again to FIG. 1, the voltage applied between the stator 125 and the rotor 115 creates an electrostatic force—more specifically, moment—that operates to rotate the rotor 115 in a direction that increases the capacitance between the stator 125 and the rotor 115. In some embodiments, attraction forces are created when the rotor 115 and the stator 125 are conducting currents. Because attraction forces are generated, the voltage applied between the stator 125 and the rotor 115 may be pulsed when the rotor 115 is moving in a direction towards greater capacitance. Otherwise, if the voltage is pulsed at other instances, the forces will counteract the rotation of the rotor 115.

Figure 4:
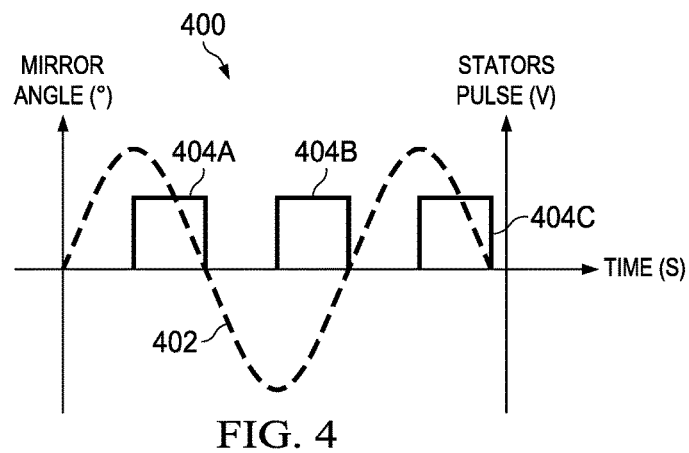
FIG. 4 illustrates a timing diagram showing example activation pulse instances for the embodiment wherein the MEMS mirror is fabricated as an in-plane resonance mirror.
Figure 5:
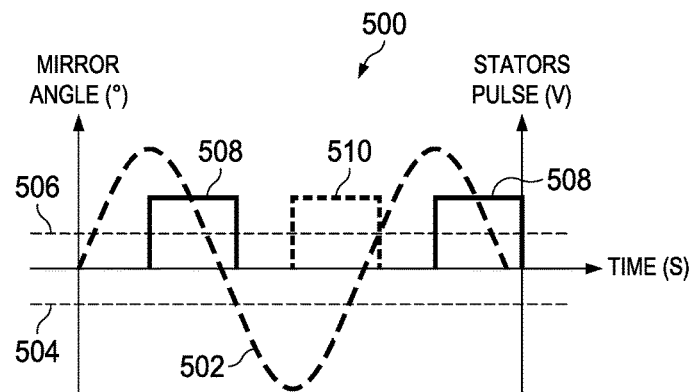
FIG. 5 illustrates an example timing diagram of activation pulse instances for a staggered MEMS mirror embodiment where one pulse is applied to each stator.
Figure 6:
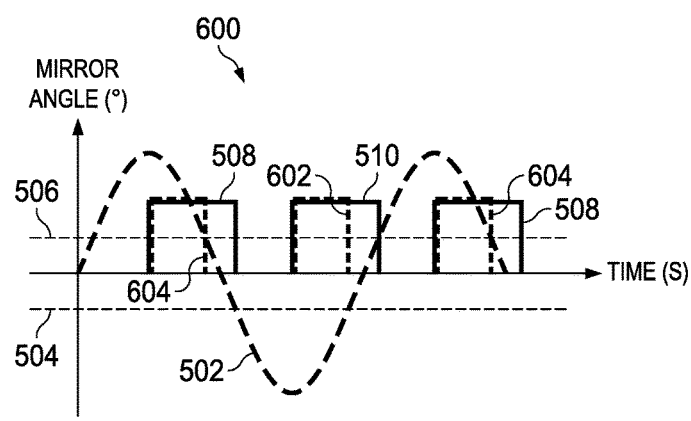
FIG. 6 illustrates an example timing diagram of activation pulse instances for a staggered MEMS mirror embodiment where two pulses are applied to each stator.

FIG. 4 provides a timing diagram 400 illustrating example activation pulse instances for the embodiment wherein the MEMS mirror 100 is fabricated as an in-plane resonance mirror. FIGS. 5 and 6 provide timing diagrams illustrating example activation pulse instances for the embodiment wherein the MEMS mirror 100 is fabricated as a staggered mirror.

In FIG. 4, timing of the pulses is shown relative to a waveform 402 representing the mirror angle. In the embodiment illustrated in FIG. 4, both stator portions 125A and 125B are activated by the same pulse 404. A first pulse 404A is initiated at the peak of the waveform 402, when the mirror angle is at its greatest positive value. The first pulse 404A terminates when the mirror angle is at 0°. The second pulse 404B is initiated at the trough of the waveform 402, when the mirror angle is at its greatest negative value. The second pulse 404B terminates when the mirror angle is at 0°. Finally, a third pulse 404C is shown similar to the first pulse 404A. The third pulse 404C is initiated at the peak of the waveform 402, when the mirror angle is at its greatest positive value, and terminates when the mirror angle is at 0°.

In FIG. 5, the timing diagram 500 illustrates pulses shown relative to a waveform 502 representing the mirror angle, the angle of maximum capacitance for the first stator portion 125A (represented by line 504), and the angle of maximum capacitance for the second stator portion 125B (represented by line 506). In this embodiment, a pulse 508 is applied to the first stator portion 125A, commencing when the mirror angle is at its greatest positive value and terminating when the mirror angle reaches line 504, which represents the angle of maximum capacitance for the first stator portion 125A. Similarly, pulse 510 is applied to the second stator portion 125B, commencing when the mirror angle is at its greatest negative value and terminating when the mirror angle reaches line 506, which represents the angle of maximum capacitance for the second stator portion 125A.

FIG. 6 illustrates a timing diagram 600 of another example embodiment for pulsing the staggered mirror embodiment of the MEMS mirror 100, wherein the pulsing scheme provided in FIG. 5 is modified to include second pulses for each of the stator portions 125A/125B. The timing of the pulses is shown relative to the waveform 502 representing the mirror angle, the angle of maximum capacitance for the first stator portion 125A (represented by line 504), and the angle of maximum capacitance for the second stator portion 125B (represented by line 506). In this embodiment, two pulses (a primary pulse and a secondary pulse) are initiated per cycle for each portion of the stator. Consistent with the timing diagram 500 of FIG. 5, the first pulse 508 (a first primary pulse) is applied to the first stator portion 125A, commencing when the mirror angle is at its greatest positive value and terminating when the mirror angle reaches line 504, which represents the angle of maximum capacitance for the first stator portion 125A. As shown in the timing diagram 600 of FIG. 6, however, a second pulse 602 (a first secondary pulse) is applied to the first stator portion 125A, commencing when the mirror angle is at its greatest negative value and terminating when the mirror angle reaches line 504. As shown in FIG. 6, the second pulse 602 (the secondary pulse) applied to the first stator portion 125A has a shorter duty cycle than the first pulse 508 (the primary pulse) applied to the first stator portion 125A.

Similarly, and consistent with the timing diagram 500 of FIG. 5, the first pulse 510 (a second primary pulse) is applied to the second stator portion 125B, commencing when the mirror angle is at its greatest negative value and terminating when the mirror angle reaches line 506, which represents the angle of maximum capacitance for the second stator portion 125B. As shown in the timing diagram 600 of FIG. 6, however, a second pulse 604 (a second secondary pulse) is applied to the second stator portion 125B, commencing when the mirror angle is at its greatest positive value and terminating when the mirror angle reaches line 506. As shown in FIG. 6, the second pulse 604 (the secondary pulse) applied to the second stator portion 125B has a shorter duty cycle than the first pulse 510 (the primary pulse) applied to the second stator portion 125B.

As shown in FIG. 6, the second pulses 602 and 604 are applied to the respective first and second stator portions 125A and 125B when the absolute value of the mirror opening angle is greater than the angle of maximum capacitance for the respective stator portion 125A/125B.

In the embodiments discussed herein, MEMS mirrors have a quality factor (Q) that is relatively high and controlled primarily by air friction. At atmospheric pressure, a typical quality factor could be in the range of several hundreds to one thousand, whereas packaging the mirror in a low pressure environment may increase the quality factor to tens of thousands or even over hundreds of thousands. While at low quality factor (e.g., in atmospheric pressure), a control system may be relatively simple because the mirror may have bandwidth of only a few Hertz. Conversely, at high quality factor, the control system becomes more complex with a bandwidth that is fractions of a Hertz that is needed to track temperature changes that may cause variations of tens of Hertz.

One method for monitoring the crossover point (i.e., the point in time at which the mirror is parallel to the plane, that is, having a mirror angle of 0°) of an in-plane mirror is described in U.S. Pat. No. 8,553,308, which is incorporated herein by reference. In U.S. Pat. No. 8,553,308, the crossover point is detected by monitoring the current through the stators. The current i through a stator is represented by the following equation:

$$i = \frac{dq}{dt} = \frac{d((c_p+c)v)}{dt} = c\frac{d(v)}{dt} + v\frac{d(c_p+c)}{dt} \quad \text{Equation (1)}$$

where $c_p$ is the parasitic capacitance of the wiring, which is constant, v represents the voltage, and c is the capacitance. Accordingly, Equation (1) can be reduced to the following:

$$i = c\frac{d(v)}{dt} + v\frac{d(c)}{dt}.$$

To eliminate the switching effect of v, U.S. Pat. No. 8,553,308 proposes using only one pulse per mirror cycle and adding a small DC voltage during the remainder of the time for monitoring $$v\frac{d(c)}{dt}.$$

However, this proposed method of monitoring the crossover point is not suitable for both in-pane and staggered MEMS mirror embodiments.

The system and method for a MEMS mirror control system proposed herein is suitable for both in-plane mirror embodiments as well as staggered mirror embodiments. It is also suitable for high quality factor mirrors that usually involve complex electronics for tracking the mirror operating frequency.

In accordance with the present disclosure, the current through the relevant stator portion is monitored to determine when to terminate the pulse applied to the respective stator portion. Referring again to Equation (1), and assuming a steady state with a driving pulse v, with v being constant at the moment, the current i through the stator is:

$$i = v\frac{d(c)}{dt}.$$

When approaching the maximum capacitance, $$\frac{d(c)}{dt}$$

is positive and/is positive. At the moment after reaching maximum capacitance, i becomes negative. Put differently, considering the perspective of the power supply, as long as the power supply current is positive, sourcing current from the positive terminal, the power supply transfers energy to the load. At the moment the current is moving towards the positive terminal, the power supply receives the energy. The pulse should be switched off at the moment the current i becomes negative.

As discussed below, the disclosed control system creates a window positioned near the end of each pulse for monitoring and detecting a direction change of the current i. Once this direction change is observed, the pulse is terminated at that time. If no change of direction is detected, the pulse terminates at the end of its standard pulse cycle as discussed above with respect to FIGS. 4-6. In other words, if the direction change occurs during the window, the pulse is terminated early—at the time of the direction change—otherwise the pulse terminates as indicated above.

Figure 7:
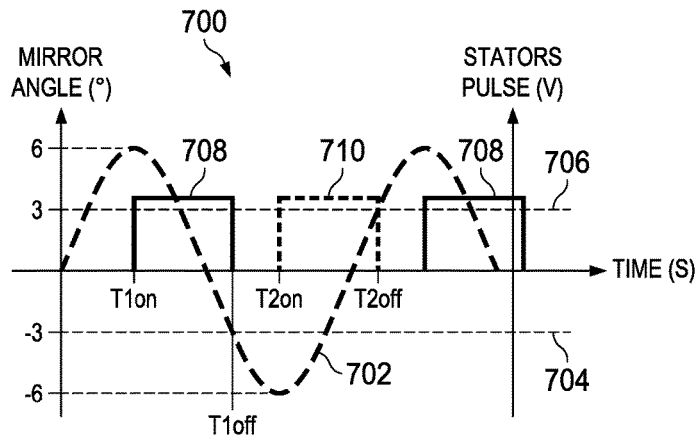
FIG. 7 illustrates a timing diagram for a staggered MEMS mirror embodiment designed for a 6° opening angle with maximum capacitance achieved at 3°.

In some embodiments, the disclosed mirror control system is based on a free-running clock that provides the timing pulses for the mirror 100. A ten-stage counter (1024 clock cycles counting from 0 to 1023) may be implemented in some embodiments to provide sufficient resolution for timing manipulations. For example, FIG. 7 provides a timing diagram 700 for a staggered mirror embodiment of the MEMS mirror 100 designed for +/−6° opening with maximum capacitance achieved at +/−3°. The timing diagram 700 is similar to that shown in FIG. 5, and illustrates the pulses applied to the stator portions 125A/125B for the +/−3° and +/−6° angle values.

As shown in FIG. 7, timing of the pulses is shown relative to a waveform 702 representing the mirror angle, the −3° angle of maximum capacitance for the first stator portion 125A (represented by line 704), and the 3° angle of maximum capacitance for the second stator portion 125B (represented by line 706). In this embodiment, the MEMS mirror 100 is designed for +/−6° opening. Accordingly, the waveform 702 has a peak value of 6° and a trough value of −6°. A pulse 708 is applied to the first stator portion 125A, commencing at T1on when the mirror angle is at 6° and terminating at T1off when the mirror angle reaches −3° at line 704, which represents the angle of maximum capacitance for the first stator portion 125A. Similarly, pulse 710 is applied to the second stator portion 125B, commencing at T2on when the mirror angle is at −6° and terminating at T2off when the mirror angle reaches 3° at line 706, which represents the angle of maximum capacitance for the second stator portion 125A.

The duty cycle of each pulse is controlled in accordance with the counter. The counter is designed to complete counting at a slower frequency than the lowest resonance frequency that is accepted for the mirror 100, when accounting for the design of the mirror and any acceptable variance. For example, if the mirror 100 is designed for 20 KHz operation with a variance of +/−700 Hz, the counter should be designed slightly lower than 19.3 KHz to account for temperature and other environmental variations. For example, setting the frequency to 19.2 KHz should be sufficient to account for small frequency variations that result from various factors such as temperature changes and air viscosity.

In accordance with the present disclosure, a window is opened near the end of each pulse to monitor the current through the relevant stator portion 125A/125B. At the moment the current becomes negative, the counter is set to a specific value to indicate termination of the pulse, as discussed in greater detail below.

In some embodiments, a count from 0 to 1023 provides for one mirror cycle, accounting for both pulse 708 and pulse 710, wherein each pulse is 512 clock cycles. It should be appreciated, however, the exact design may vary for different implementations. In the example illustrated in FIG. 7, the clock starts at count zero at T1on and ends at count 1023 at T2off. The counter resets to zero immediately thereafter. Because the counter is slower than the actual mirror resonance rate, "T1off" occurs at timer value of 511 or sooner and "T2off" occurs at timer value 1023 or sooner.

Towards the end of each pulse (i.e., pulse 708 and pulse 710), a window is opened to monitor the current across the relevant stator portion 125A/125B. When the current changes direction (becomes negative), the counter is set to the relevant defined value to indicate the end of the respective pulse 708/710. For example, if the window is opened towards the end of pulse 708 (i.e., at T1off), the current (i1) of the first stator portion 125A is monitored. When current i1 becomes negative, the counter is set to the value of 512. Similarly, if the window is opened at the end of pulse 710 (i.e., at T2off), the current (i2) of the second stator portion 125B is monitored. When current i2 becomes negative, the counter is set to a value of 0.

Figure 8:
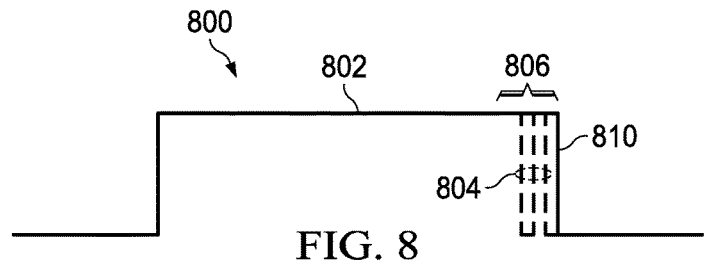
FIG. 8 illustrates an example waveform for an example activation pulse and potential points of pulse termination that occur during a window period opened towards the end of the pulse.

FIG. 8 illustrates an example waveform 800 for an example activation pulse 802 and potential points 804 of pulse termination that occur during a window period 806 opened towards the end of the pulse 802. The points 804 of termination represent potential instances of the counter where the current change could occur and the pulse 802 would then terminate. If no current change is detected, the pulse 802 terminates at the end 808 of the window 806. It should also be appreciated that a limited window reduces susceptibility to erroneous detection in noisy environments.

In some embodiments, the counter values of the T1on and T1off times may be calculated in accordance with the following equations. The pulse length is equal to the time from the positive peak in FIG. 7 to the point of negative maximum capacitance. In accordance with the embodiment illustrated in FIG. 7, the maximum opening angle is +/−6°, and the position of maximum capacitance is +/−3°. Mirror function is represented by the following equation:

$$\theta(t) = \theta_{max} \sin(2\pi f t)$$

Where $\theta_{max} = 6°$, and f=20 KHz. This formula may be used to determine the tame lapsed (t) from $\theta(t)=6°$ to $\theta(t)=-3°$. Accordingly, $$t = \frac{1}{2\pi f} \operatorname{asin}\left(\frac{\theta(t)}{\theta_{max}}\right) = \frac{T}{2\pi} \operatorname{asin}\left(\frac{\theta(t)}{\theta_{max}}\right),$$

where T is the cycle time of the mirror. Substituting the respective angles yields the following equation:

$$\Delta t = \frac{T}{2\pi}\left[\operatorname{asin}\left(\frac{-3}{6}\right) - \operatorname{asin}\left(\frac{6}{6}\right)\right] = \frac{T}{2\pi}[\operatorname{asin}(-0.5) - \operatorname{asin}(1)] \quad \text{Equation (2)}$$

which may be simplified as:

$$\Delta t = \frac{T}{2\pi}\left[\pi + \frac{\pi}{6} - \frac{\pi}{2}\right].$$

Figure 9:
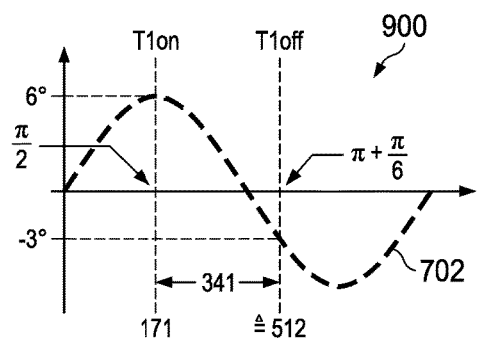
FIG. 9 illustrates a timing diagram of the waveform of FIG. 7 with the counter values provided at T1on and T1off locations.

In Equation (2)

$$\frac{\pi}{2}$$

represents T1on at the maximum opening angle, and $$\pi + \frac{\pi}{6}$$

represents T1off at the position of maximum capacitance, as shown in FIG. 9. FIG. 9 illustrates a timing diagram 900 of the waveform 702 of FIG. 7 with the counter values provided at the T1on and T1off locations.

Finally, this equation can be further simplified as follows:

$$\Delta t = \frac{T}{2\pi}\left[\frac{2\pi}{3}\right] = \frac{T}{3}.$$

For a counter of 1024 cycles, the count for a pulse commencing at T1on and terminating at T1off is:

$$\Delta N = \frac{1024}{3} \approx 341,$$

where ΔN represents the logical value of the counter in bits, which represents the corresponding time in seconds.

With reference to the timing diagrams 700 and 900 in FIGS. 7 and 9, respectively, the counter is set to 512 (half of the counter's maximum count) to indicate the normal termination point of pulse 708. Thus, T1off ≙ 512, and T1on=512−341=171. Pulse 708 commences at clock cycle 171, and terminates at about 512, having a length of 341 clock cycles. T2on and T2off may be calculated in a similar manner. Assuming the T2off counter value is 1024=0, and T2on occurs exactly one half mirror cycle later than T1off, T2on is as follows: T2on=1024−341=683.

As previously mentioned, the free-running clock should cover the lowest resonance frequency accommodated by the mirror 100. Again, assuming a designed resonance value of 20 KHz with a manufacturing tolerance of +/−500 Hz, and assuming temperature and other environmental conditions may vary tolerance by +/−50 Hz, the resonance frequency could be a value between 19,450 Hz and 20,550 Hz. Accordingly, the clock used for the counter should have an operating frequency of 19450×1024≈19.916 MHz.

Referring briefly to FIGS. 7 and 8, the length of the window 806 should be such that it accommodates the fastest resonance frequency of the mirror 100. In the above example, this is 20,550 Hz. Accordingly, the pulse length for the fastest resonance is 341×(19450/20550)≈322 clock cycles. Thus, for a pulse length of 341 clock cycles, the window should begin at clock cycle 322 of the pulse (i.e., the 322$^{nd}$ clock cycle since the pulse commenced) and close at the earlier of: (i) detection of a negative current on the respective stator, or (ii) clock cycle 431 of the pulse (i.e., the 431$^{st}$ clock cycle since the pulse commenced). Applying this range to pulse 708 of FIG. 7, the window opens at clock cycle 493 and closes at clock cycle 512, which is the end of the pulse 708, assuming the current i1 does not become negative during the window (i.e., clock cycles 493-512). It should be understood from the foregoing that similar calculations may be performed to calculate the window for the pulse 710 applied to the second stator portion 125B.

Just as the timing diagram 500 of FIG. 5 was modified in FIG. 6 to accommodate a second pulse for each stator portion, so too can the timing diagram 700 of FIG. 7. This modification is illustrated by the timing diagram 1000 shown in FIG. 10.

Figure 10:
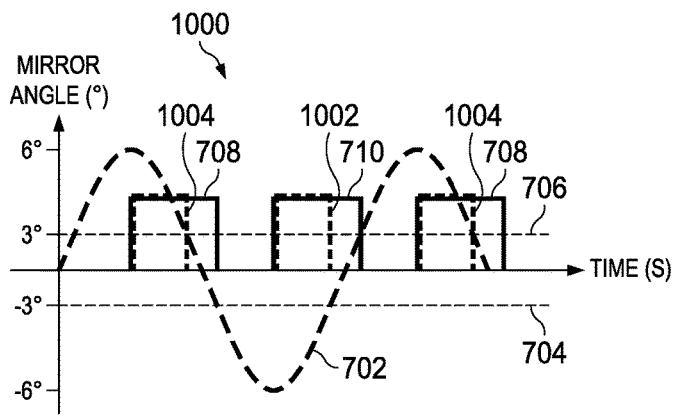
FIG. 10 illustrates a timing diagram for pulsing a staggered MEMS mirror embodiment having two pulses applied to each stator.

FIG. 10 illustrates a timing diagram 1000 similar to that provided in FIG. 6 for pulsing the staggered mirror embodiment of the MEMS mirror 100, wherein the pulsing scheme provided in FIG. 7 is modified to include second pulses (secondary pulses) for each of the stator portions 125A/125B. The timing of the primary and secondary pulses is shown relative to the waveform 702 representing the mirror angle, the angle of maximum capacitance for the first stator portion 125A (represented by line 704), and the angle of maximum capacitance for the second stator portion 125B (represented by line 706). In this embodiment, two pulses are initiated per cycle for each portion of the stator. Consistent with the timing diagram 700 of FIG. 7, the first pulse 708 (a first primary pulse) is applied to the first stator portion 125A, commencing when the mirror angle is at 6° and terminating when the mirror angle reaches −3° at line 504, which represents the angle of maximum capacitance for the first stator portion 125A. As shown in the timing diagram 1000 of FIG. 10, however, a second pulse 1002 (a first secondary pulse) is applied to the first stator portion 125A, commencing when the mirror angle is at its lowest value) (−6° and terminating when the mirror angle reaches −3° at line 504. As shown in FIG. 10, the second pulse 1002 (the secondary pulse) applied to the first stator portion 125A has a shorter duty cycle than the first pulse 708 (the primary pulse) applied to the first stator portion 125A.

Similarly, and consistent with the timing diagram 700 of FIG. 7, the first pulse 710 (a second primary pulse) is applied to the second stator portion 125B, commencing when the mirror angle is at its lowest value (−6°) and terminating when the mirror angle reaches 3° at line 706, which represents the angle of maximum capacitance for the second stator portion 125B. As shown in the timing diagram 1000 of FIG. 10, however, a second pulse 1004 (a second secondary pulse) is applied to the second stator portion 125B, commencing when the mirror angle is at its greatest value (6°) and terminating when the mirror angle reaches 3° at line 706. As shown in FIG. 10, the second pulse 1004 (the secondary pulse) applied to the second stator portion 125B has a shorter duty cycle than the first pulse 710 (the primary pulse) applied to the second stator portion 125B.

Figure 11:
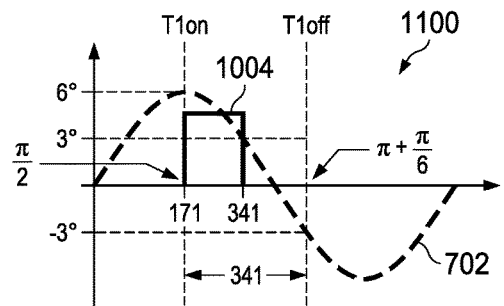
FIG. 11 illustrates a timing diagram of the waveform of FIG. 7, showing the second pulse for the second stator portion relative to the waveform and the respective counter values that correspond to the start and end of the pulse.

The foregoing disclosure can also be implemented to generate windows for the second pulses provided in the embodiment described above and illustrated in FIG. 10. For example, FIG. 11 illustrates a timing diagram 1100 of the waveform 702 similar to that shown in FIG. 9. In addition to what is provided in FIG. 9, the timing diagram 1100 shows the second pulse 1004 for the second stator portion 125B relative to the waveform 702 and the respective counter values that correspond to the start and end of the pulse 1004.

As shown in FIG. 11, the on time of the pulse 1004 is the same as T1on, which is counter value 171. The pulse 1004 terminates when the mirror angle is 3°. Therefore, the length of pulse 1004 is the time it takes for the mirror to change its angle from 6° to 3°. The mirror equation is θ(t)=θ$_{max}$ sin(2πft). So, with θ$_{max}$=6°, the time it takes for a sine wave to change from a value of 1 to 0.5 is $$\frac{\pi}{3}.$$

Thus, the length of pulse 1004 is $$\frac{\pi}{3},$$

which is equal to a count of approximately 170 clock cycles. Accordingly, counting will commence for the pulse 1004 at a counter value of 171, and will terminate at a value of 341.

Although it is not shown in FIG. 11, it should be appreciated that the second pulse of the first stator portion 125A (see pulse 1002 in FIG. 10), is delayed relative to the pulse 1004 in FIG. 10 by half a mirror cycle, or 512 clock cycles. Thus, the second pulse of the first stator portion 125A (pulse 1002) will commence at counter value 683 (171+512=683) and will terminate at counter value 853 (683+170=853).

Again assuming a clock operating at 19.916 MHz, the length of the window for the second pulses (i.e., pulses 1002 and 1004) should be such that it accommodates the fastest resonance frequency of the mirror 100. In the above example, this is 20550 Hz. Accordingly, for the lengths of the second pulses (170 clock cycles each), the fastest resonance is 170×(19450/20550) 161 clock cycles. Thus, for a pulse length of 170 clock cycles, the window should begin at clock cycle 161 of the pulse (i.e., the 161$^{st}$ clock cycle since the pulse commenced) and close at the earlier of: (i) detection of a negative current on the respective stator, or (ii) clock cycle 170 of the pulse (i.e., the 170$^{th}$ clock cycle since the pulse commenced). Applying this range to pulse 1004 of FIGS. 10 and 11, the window opens at clock cycle 332 and closes at clock cycle 341, which is the end of the pulse 1004, assuming the current i2 does not become negative during the window (i.e., clock cycles 332-341). It should be understood from the foregoing that similar calculations may be performed to calculate the window for the second pulse 1002 applied to the first stator portion 125A.

Because activating the second pulses 1002/1004 from the start may create ambiguity (both stator portions are operating), it may be desirable in some embodiments to enable the second pulses 1002/1004 after the mirror almost achieves its working opening angle (e.g., when the mirror is at 80%-90% of the required opening angle). Then, when steady state is achieved with one pulse, the second pulse could be activated to account for the remaining 10%-20% of the opening angle.

Figure 12:
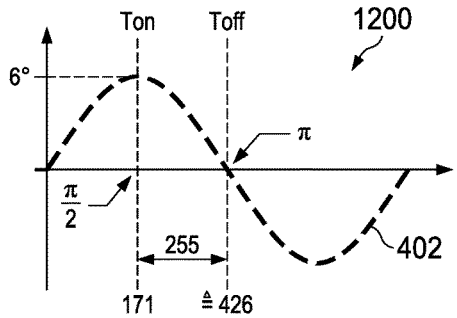
FIG. 12 illustrates a timing diagram showing the waveform of FIG. 4 and the respective counter values that correspond to start (Ton) and end (Toff) of the pulse.

It should be appreciated that the above disclosure may also be applied to the in-plane embodiment of the MEMS mirror 100. Accordingly, the timing of the pulses 404 provided in FIG. 4 may be calculated similar to the pulses 708 and 710, except that the pulses 404 terminate at the zero crossing. FIG. 12 provides an example timing diagram 1200 showing the waveform 402 of FIG. 4 and the respective counter values that correspond to start (Ton) and end (Toff) of the pulse 404.

Referring now to FIGS. 4 and 12, pulse 404 commences at Ton, which is at the maximum opening angle of the waveform 402. In accordance with the above example where this angle is 6°, the counter value is 171 at Ton. The pulse 404 terminates at Toff when the mirror angle is 0°. The pulse length is $$\frac{\pi}{2},$$

which is equal to a count of approximately 255 clock cycles. Thus, the pulse 404 has a length of approximately 255 clock cycles. Therefore, counting will commence for the pulse 404 at a counter value of 171, and will terminate at a value of about 426.

Again assuming a clock operating at 19.916 MHz, the length of the window for each of the pulses 404 should be such that it accommodates the fastest resonance frequency of the mirror 100. In the above example, this is 20550 Hz. Accordingly, for the length of the pulse 404 (255 clock cycles), the fastest resonance is 255×(19450/20550) 241 clock cycles. Thus, for a pulse length of 255 clock cycles, the window should begin at clock cycle 241 of the pulse (i.e., the 241$^{st}$ clock cycle since the pulse commenced) and close at the earlier of: (i) detection of a negative current on the stator, or (ii) clock cycle 255 of the pulse (i.e., the 255$^{th}$ clock cycle since the pulse commenced). Applying this range to pulse 404 of FIGS. 4 and 12, the window opens at clock cycle 412 and closes at clock cycle 426, which is the end of the pulse 404, assuming the current i does not become negative during the window (i.e., clock cycles 412-426).

In some embodiments, the disclosed control system is capable of controlling the opening angle of a staggered embodiment of the MEMS mirror 100.

Figure 13A:
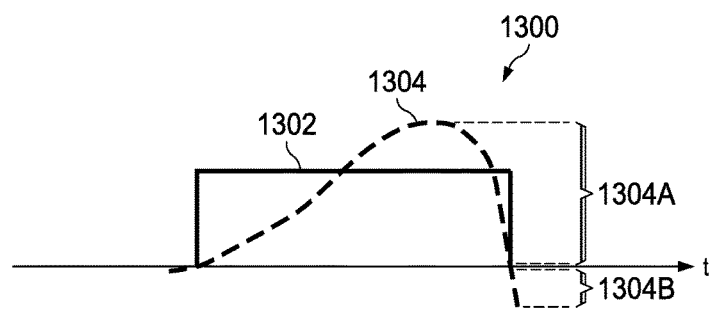
FIGS. 13A and 13B illustrate a schematic timing diagram for an example activation pulse and a waveform representing the corresponding moment of the rotor caused by the pulse.

Referring now to FIG. 13A, a schematic timing diagram 1300 is shown for an example activation pulse 1302 and a waveform 1304 representing the corresponding moment of the rotor 115 caused by the pulse 1302. At the start of the pulse 1302, the moment 1304 is low due to the distance between the stator portion 125A/125B and the rotor fingers 110, which are located apart from each other. As the rotor fingers 110 approach the respective stator portion 125A/125B, the moment 1304 increases and, at the point of maximum capacitance, it quickly switches from positive current 1304A to negative current 1304B.

As discussed herein, the pulse 1302 is switched off as soon as the negative current 1304B is sensed. Because this current detection and subsequent switching cannot be done in zero time, there exists an inherent delay before the pulse 1302 is switched off. This delay 1305, shown in FIG. 13B, results in a small deviation from the optimal case shown in FIG. 13A. This small delay is usually negligible.

According to Equation (1), the measured current has two components: one relating to a change in voltage and another relating to a change in capacitance. When a window is generated, the change in voltage is negligible and all transients subside, so the current measurement relies primarily on the change in capacitance.

As demonstrated in Equation (2), the optimal length of the pulse may vary according to the opening angle of the mirror. For an opening angle of 6°, Equation (2) provides the following calculations:

$$\Delta t = \frac{T}{2\pi}\left[\operatorname{asin}\left(\frac{-3}{6}\right) - \operatorname{asin}\left(\frac{6}{6}\right)\right]$$

In general, $\Delta t$ is a function of the opening angle $\theta_{max}$. Thus:

$$\Delta t(\theta_{max}) = \frac{T}{2\pi}\left[\operatorname{asin}\left(\frac{-3}{\theta_{max}}\right) - \operatorname{asin}(1)\right]$$

Figure 14:
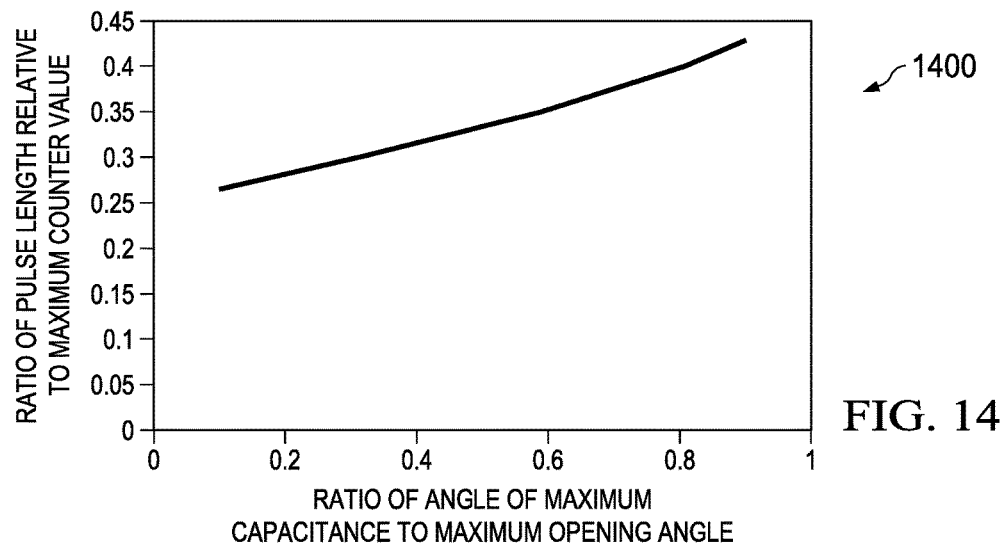
FIG. 14 illustrates a graph of normalized activation pulse length relative to the ration between angle of maximum capacitance and maximum opening angle.

Accordingly, the greater the opening angle $\theta_{max}$, the shorter $\Delta t$. This relationship is illustrated in FIG. 14, which shows a graph 1400 of normalized activation pulse length relative to the ratio between angle of maximum capacitance and maximum opening angle.

In the above example, the ratio was 3/6=0.5, and the result was 0.3333N=0.3333×1024≈341.

Figure 13B:
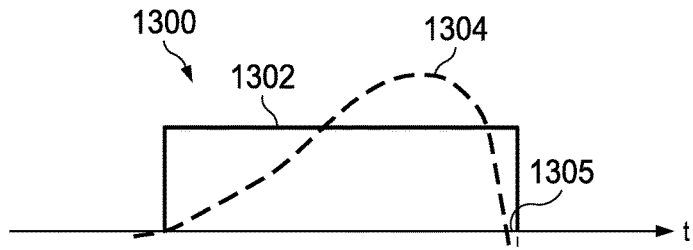
Figure 15:
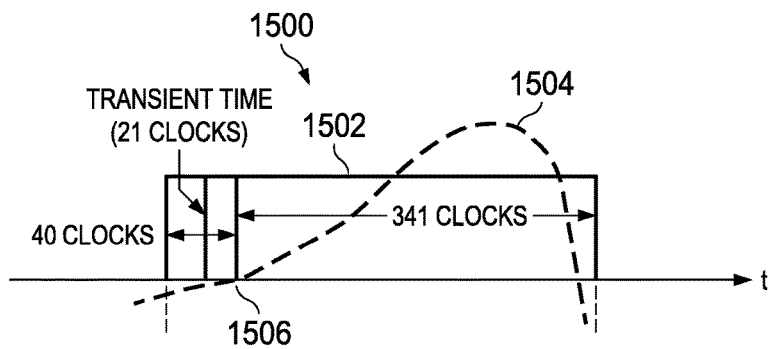
FIG. 15 illustrates an example timing diagram showing an enlarged activation pulse and corresponding moment.

At the start of the activation pulse 1302 shown in FIG. 13B, it is difficult to measure the current component of Equation (1) because the moment 1304 at that point is very low and the current, which is proportional to the moment, is also very low. Additionally, the activation pulse causes transients due to the need to charge all stray capacitances. This transient is on the order of 1 μs, because the related voltage component will mask the signal due to a voltage step function. Assuming the transient, which occurs during the rise time of the pulse 1302, takes time of Ttransient, it is possible to increase the activation pulse 1302 to a slightly longer value than Ttransient and to then measure the current at the front end of the pulse 1302 and again at the end of the pulse 1302. Because the moment 1304 is low at the beginning of the pulse 1302, the efficiency reduction will be low. FIG. 15 provides an example timing diagram 1500 showing an activation pulse 1502 and moment 1504 similar to those provided in FIG. 13B. In FIG. 15, however, the activation pulse 1502 is enlarged compared to that provided in FIG. 13B.

In the example timing diagram 1500 in FIG. 15, the transient time takes 21 clock cycles. Additionally, there is an uncertain amount of time for which the pulse 1502 could terminate early, due to the window opened near the end of the pulse 1502. In accordance with the examples provided herein, this window occurs from clock cycles 493 through 512 (19 clock cycles). The 19 clock cycles for the window are added to the 21 clock cycles located at the front end of the pulse 1502 to produce 40 clock cycles. The 40 clock cycles are added to the original pulse length of 341 clock cycles. Thus, the pulse 1502 is enlarged to a total length of 381 clock cycles as shown in FIG. 15.

Opening angle control may be implemented to ensure the mirror opening angle is correct and stable during environment changes such as air pressure variation. As explained herein, the opening angle control is coordinated with the current, specifically, the timing of positive current detection. The duration of the positive current at the stator may be measured to determine whether to increase or decrease the activation pulse 1502. The 40 clock cycles located at the front end of the pulse 1502 provide a transition to the point of opening angle control located at 1506.

In accordance with the example provided herein, the positive current should be exactly 341 clock cycles to ensure that the required opening angle is correct. In an effort to effect this timing, the counter time is measured at the termination of the pulse 1502 to determine if the pulse was 341 clock cycles. If the value of the counter at the off time indicates the pulse exceeds 341 clock cycles, the opening angle is lower than what is required. Conversely, if the value indicates the pulse was shorter than 341 clock cycles, the angle is opened more than required. The desired opening angle can be achieved by changing the value of the activating voltage according to whether the timing of the pulse is greater than 341 or less than 341 clock cycles. If the timing of the pulse is less than the desired length of 341 clock cycles, the activating voltage of the subsequent pulse is decreased. If the timing of the pulse is greater than the desired length of 341 clock cycles, the activating voltage of the subsequent pulse is increased.

Because the off-time value of the counter cannot be predicted before a pulse commences, the counter value associated with the off-time of the previous pulse is registered for the next cycle. In other words, the timing of the previous pulse is used to determine the voltage amplitude for the next pulse. For example, suppose the actual reset time of the previous pulse cycle happens exactly at a counter value of 500 (i.e., the current is detected to be negative at counter value 500). The next pulse cycle will produce a window at the beginning of the next activation pulse to monitor the current at the counter value of 500−341=159 (i.e., the 159$^{th}$ counter value of the next activation pulse). If the current is negative at counter value 159, the opening angle is too high, and the activation voltage for the subsequent activation pulse should be reduced. If the value is positive, the opening angle is too low, and the activation voltage for the subsequent activation pulse should be increased.

Figure 16:
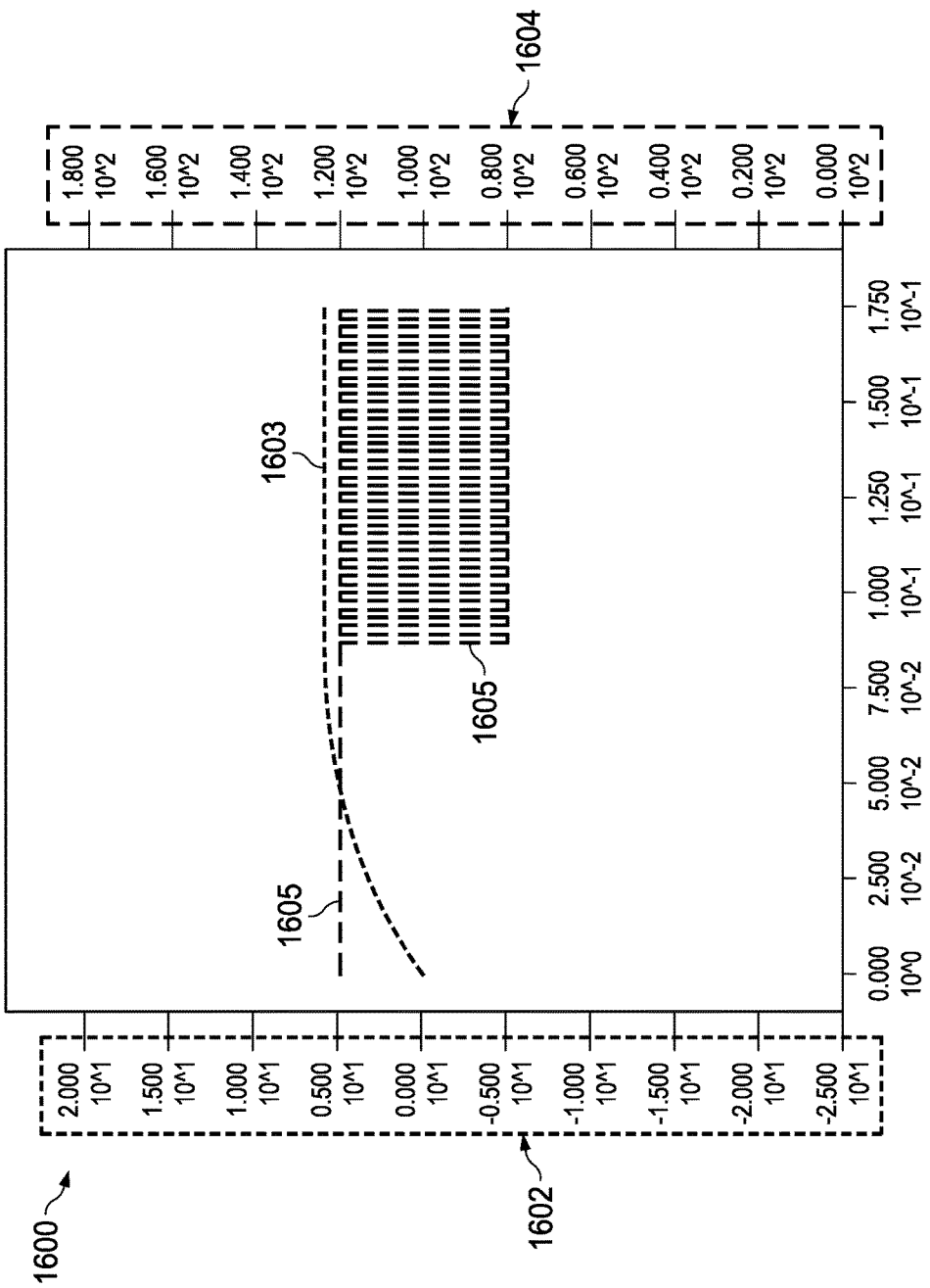
FIG. 16 illustrates a simulation for an embodiment of a controller for the disclosed staggered MEMS mirror structure.

FIG. 16 provides a graph 1600 of various waveforms corresponding to a simulation performed in accordance with the embodiments described herein. Specifically, the resonance frequency was set to 20 KHz, the angle of maximum capacitance was set to 3°, and the opening angle control system was set to 6V, with a Q of approximately 8150. FIG. 16 illustrates operation of the opening angle controller. The values 1602 and line 1603 represent the opening angle in degrees, and the values 1604 and line 1605 represent the activation voltage applied. The activation voltage was set to alternate between 80V and 120V. In the first 76 ms of the rise-up, the activation voltage was consistently at 120V. When the mirror achieves its designed opening value, the control system maintains constant opening angle by alternating between the two activation voltages.

Figure 17:
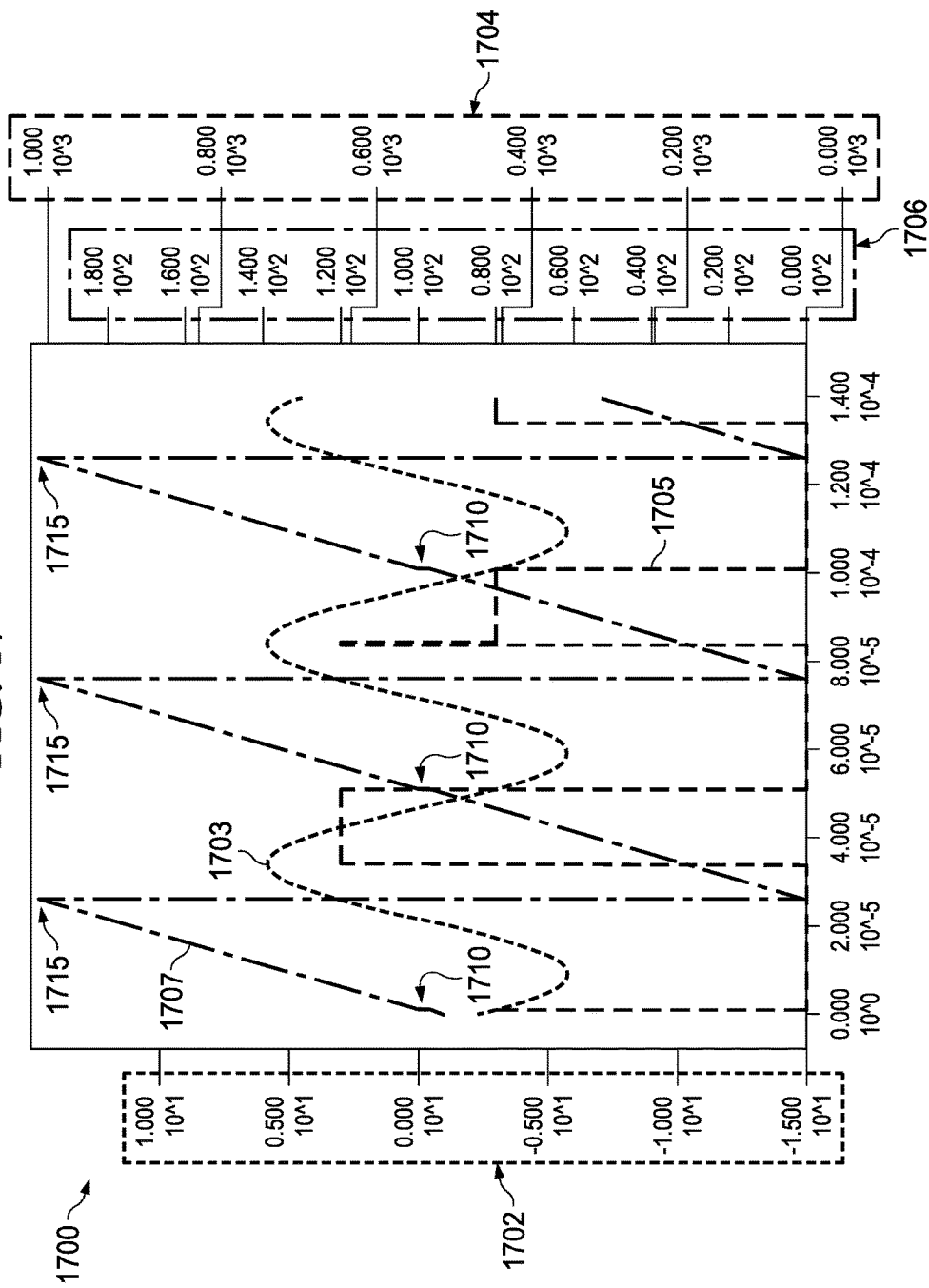
FIG. 17 illustrates a simulation of steady state operation of an embodiment of a controller for the disclosed staggered MEMS mirror structure having one pulse per stator.

FIG. 17 provides a graph 1700 of various waveforms corresponding to a simulation performed in accordance with the embodiments described herein. The graph 1700 illustrates three cycles during a steady state. The values 1702 and line 1703 represent the mirror angle, values 1704 and line 1705 represent the Stator 1 activation pulse, and the values 1706 and line 1707 represent the counter value. As shown in FIG. 17, the pulse value alternates between 80V and 120V. The counter sets to 512 at points 1710, and to a value of 0 at points 1715.

Figure 18:
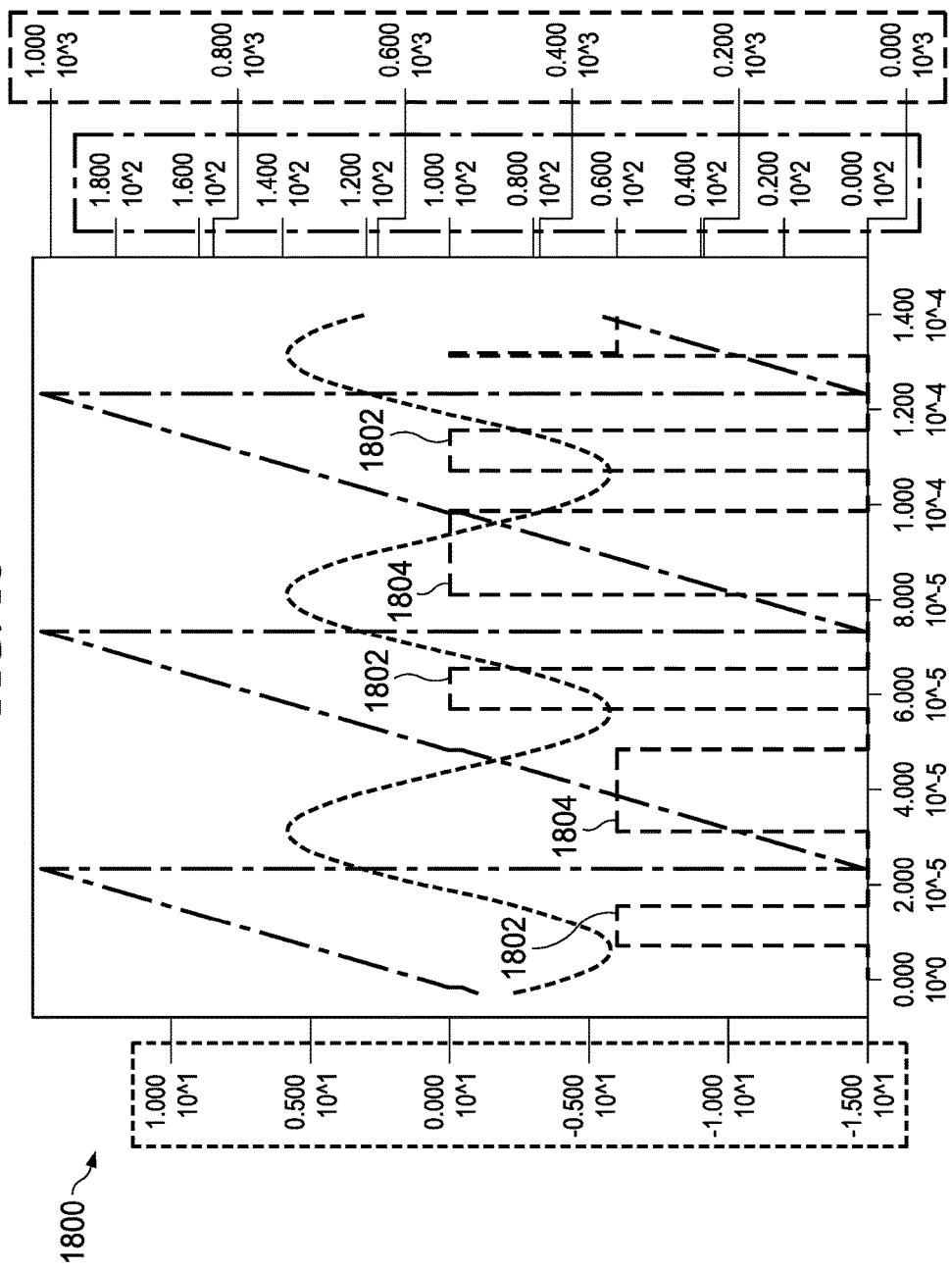
FIG. 18 illustrates a simulation of steady state operation of an embodiment of a controller for the disclosed staggered MEMS mirror structure having two pulses per stator.

FIG. 18 provides a graph 1800 of various waveforms corresponding to a simulation performed in accordance with the embodiments described herein. The graph 1800 is similar to that shown in FIG. 17, but provides a steady state having two pulses per stator. The second pulses 1802 are shorter than the first pulses 1804. Additionally, the alternating activation voltages are set to 60V and 100V to provide improved efficiency.

Figure 19:
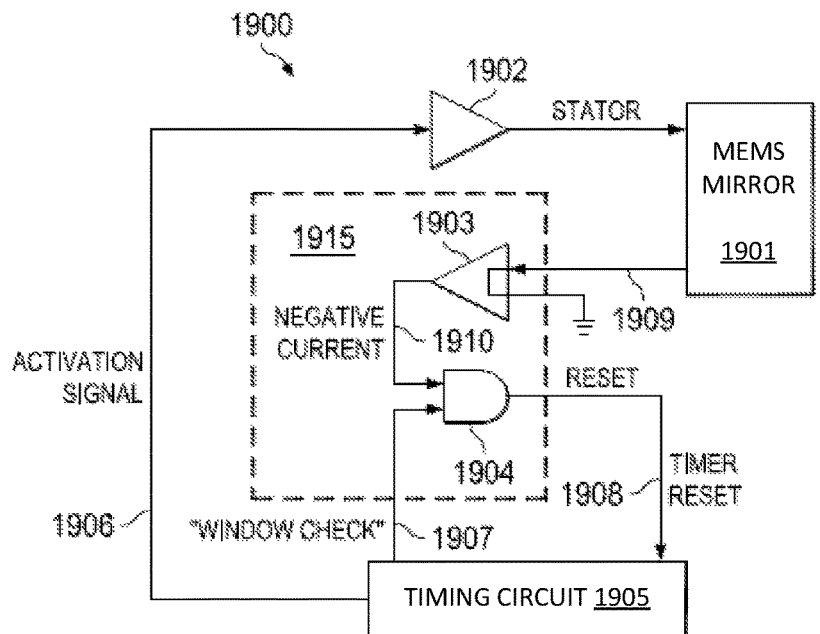
FIG. 19 illustrates an example circuit diagram for an embodiment of the disclosed control system for an in-plane MEMS mirror.

FIG. 19 illustrates an example controller circuit 1900 for controlling operation of an in-plane MEMS mirror in accordance with the present disclosure. The controller 1900 is shown connected to an in-plane MEMS mirror 1901, similar to the MEMS mirror 100 shown in FIG. 1. Specifically, a high-voltage amplifier 1902 is coupled to the stator of the in-plane mirror 1901 for providing an activation pulse in accordance with the present disclosure. A comparator 1903 is coupled to the rotor of the in-plane mirror 1901 and is used to detect the current direction as discussed herein. Alternatively, the high-voltage amplifier 1902 could be connected to the rotor and the comparator 1903 could be connected to the stator portion of the MEMS mirror 1901. The circuit 1900 also includes logic circuitry 1904 (e.g., an AND gate) connected to the output of the comparator 1903, and a timing circuit 1905 for controlling the timing of the activation pulses and the windows, as discussed herein. The comparator 1903 and logic circuitry 1904 comprise a detection circuit 1915 for monitoring the current at the mirror 1901, detecting a change in the current direction, and generating a reset signal 1908 for the timing circuit 1905.

In some embodiments, the timing circuit 1905 is a free-running resettable multivibrator or counter. The timing circuit 1905 produces an activation pulse control signal 1906 and a window activation signal 1907, and receives a reset signal 1908 from the logic circuitry 1904. When the reset signal 1908 is low, meaning there is no "timer reset," the timing circuit 1905 provides steady 50% duty cycle activation signal pulses 1906 at the lowest possible resonance frequency of the in-plane mirror 1901 according to manufacturing tolerances. When the reset signal 1908 is high (this happens during pulse activation, as explained herein), the timing circuit 1905 disables the activation pulse 1906 and restarts a new cycle, beginning with no activation signal.

The timing circuit generates the window activation signal 1907 to activate the logic circuitry 1904 during the possible appearance of a negative current. The window activation signal 1907 is generated at a frequency corresponding to the fastest possible resonance frequency of the in-plane mirror 1901 according to the manufacturing tolerances. The logic circuitry 1904 will be deactivated (i.e., the window signal 1907 will terminate) simultaneously with the end of the pulse activation signal 1906 (this could occur due to timer reset or the free-running operation of the timing circuit 1905). Accordingly, the window signal 1907 is only activated when the activation signal 1906 is activated. The operation of the window signal 1907 is intended to reduce erroneous negative current detection signals. Such erroneous signals are especially likely to appear during start of operation when currents are small and noisy.

The high voltage amplifier 1902 converts the activation signal 1906 to the high voltage level needed by the MEMS mirror 1901 to apply the activation pulses to the stator of the mirror 1901.

In some embodiments, the comparator 1903 is a transimpedance amplifier (TIA) with low impedance to ground. The comparator 1903 detects the direction of the current 1909 that flows to ground. When the current direction is towards the comparator 1903, the output 1910 will be low. When the current 1909 reverses and flows from the comparator 1903 to the in-plane MEMS mirror 1901, the output 1910 of the comparator 1903 becomes high to signal detection of a negative current. The output 1910 is further gated by the logic circuitry 1904 (e.g., AND gate) to ensure the reset signal 1908 is generated during the appropriate timing (i.e., during a window). The logic circuitry 1904 then produces the reset signal 1908 to reset the timer 1905.

Figure 20:
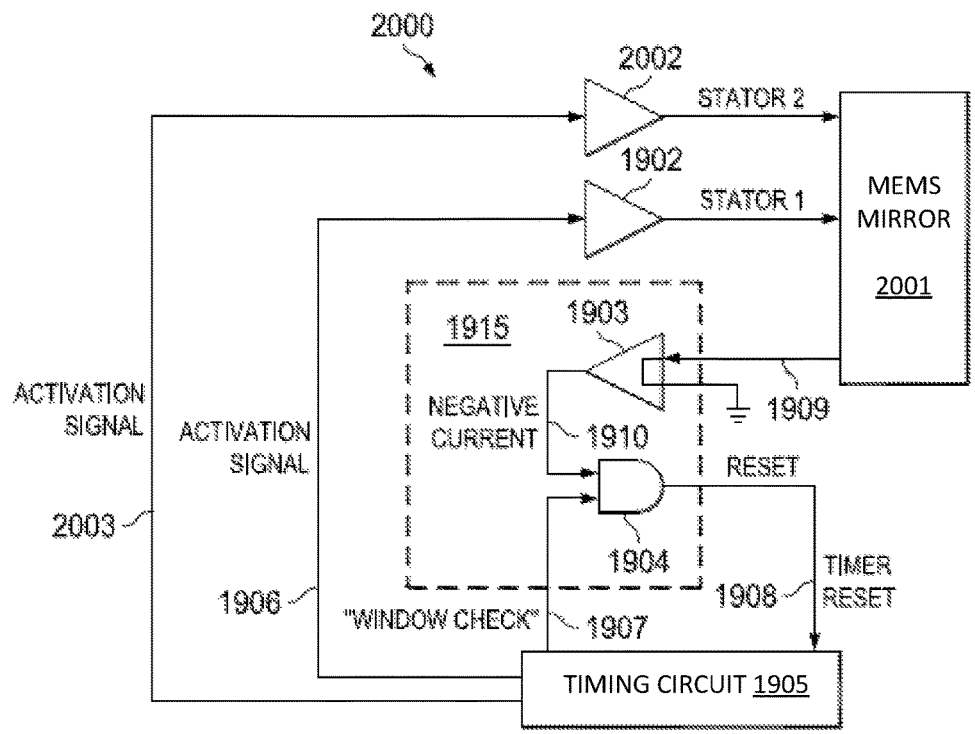
FIG. 20 illustrates an example circuit diagram for an embodiment of the disclosed control system for a staggered MEMS mirror.

FIG. 20 illustrates an example controller circuit 2000 for controlling operation of a staggered MEMS mirror 2001 in accordance with the present disclosure. The staggered MEMS mirror 2001 requires two different activation pulses—one for each stator portion. The controller provided in FIG. 20 is similar to the controller 1900 in FIG. 19, except that the controller 2000 is connected to a staggered MEMS mirror 2001, and includes a second high voltage amplifier 2002. The first high voltage amplifier 1902 is connected to a first stator portion of the mirror 2001, and the second high voltage amplifier 2002 is connected to a second stator portion of the mirror 2001. The first high voltage amplifier 1902 receives the activation signal 1906 to generate the first activation pulses for the mirror 2001. Specifically, the first amplifier 1902 converts the first activation signal 1906 to the high voltage level needed by the MEMS mirror 2001 to apply the activation pulses to the first stator portion of the mirror 2001. The second high voltage amplifier 2002 receives a second activation signal 2003 from the timing circuit 1905 and generates the second activation pulses for the mirror 2001. Specifically, the second amplifier 2002 converts the second activation signal 2003 to the high voltage level needed by the MEMS mirror 2001 to apply the second activation pulses to the second stator portion of the mirror 2001. Generally, due to manufacturing process restrictions, there is one joint rotor for both stators. Thus, the rotor could be connected to a single comparator 1903 which is used for controlling both stators. The comparator 1903 detects the current of the one, activated stator at the detection time.

As disclosed herein, the controller circuit 2000 may be used to provide only one pulse per stator portion per cycle as discussed with reference to FIGS. 5 and 7. In other embodiments, the controller circuit 2000 may be used to provide two pulses per stator portion per cycle as discussed with reference to FIGS. 6 and 10. In this embodiment, the first pulses are provided by the first activation signal 1906 and first high voltage amplifier 1902, and the second pulses are provided by the second activation signal 2003 and second high voltage amplifier 2002. Accordingly, the window signal 1907 is only active when either the first or second activation signals 1906 and 2003 are active.

In the embodiment illustrated in FIGS. 19 and 20, it should be appreciated that the connections to the stator and rotor may be swapped such that the amplifier circuitry 1902 and 2002 are coupled to the rotor and the comparator 1903 is connected to the stator portion. This is because the circuit between the stator and rotor is essentially a variable capacitor.

The foregoing description has provided by way of exemplary and non-limiting examples a full and informative description of one or more exemplary embodiments of this invention. However, various modifications and adaptations may become apparent to those skilled in the relevant arts in view of the foregoing description when read in conjunction with the accompanying drawings and the appended claims. However, all such and similar modifications of the teachings of this invention will still fall within the scope of this invention as defined in the appended claims.

What is claimed is:

1. A control circuit for controlling operation of a resonance MEMS mirror, the control circuit comprising:
    timing circuitry configured to control timing of activation pulses for operating the MEMS mirror;
    amplifier circuitry configured to receive a first control signal from the timing circuitry and, responsive thereto, to generate a first set of activation pulses for operating the MEMS mirror; and
    a detection circuit configured to detect current at the MEMS mirror and to generate a reset signal in response to detecting a change in the direction of the current at the MEMS mirror;
    wherein the timing circuitry is further configured to terminate an activation pulse in response to receiving the reset signal from the detection circuit.

2. The control circuit of claim 1, wherein the MEMS mirror is an in-plane MEMS mirror.

3. The control circuit of claim 1, wherein the MEMS mirror is a staggered MEMS mirror.

4. The control circuit of claim 1, wherein the detection circuit comprises:
    comparator circuitry configured to detect the direction of the current at the MEMS mirror and to generate a signal to indicate the change in the direction of the current at the MEMS mirror; and
    logic circuitry configured to receive the signal from the comparator circuitry and, responsive thereto, to generate the reset signal.

5. The control circuit of claim 1, wherein the first set of activation pulses includes a first primary pulse applied to a first portion of the MEMS mirror and a second primary pulse applied to a second portion of the MEMS mirror.

6. The control circuit of claim 5, wherein the first primary pulse commences when an angle of the MEMS mirror is at its greatest positive value and terminates at an angle of maximum capacitance for the first portion of the MEMS mirror, and wherein the second primary pulse commences when the angle of the MEMS mirror is at its greatest negative value and terminates at an angle of maximum capacitance for the second portion of the MEMS mirror.

7. The control circuit of claim 1, wherein the amplifier circuitry is further configured to receive a second control signal from the timing circuitry and, responsive thereto, to generate a second set of activation pulses for operating the MEMS mirror.

8. The control circuit of claim 7, wherein the second set of activation pulses includes a first secondary pulse applied to a first portion of the MEMS mirror and a second secondary pulse applied to a second portion of the MEMS mirror.

9. The control circuit of claim 8, wherein the first secondary pulse commences when an angle of the MEMS mirror is at its greatest negative value and terminates at an angle of maximum capacitance for the first portion of the MEMS mirror, and wherein the second secondary pulse commences when the angle of the MEMS mirror is at its greatest positive value and terminates at an angle of maximum capacitance for the second portion of the MEMS mirror.

10. The control circuit of claim 7, wherein each of the activation pulses in the second set have a shorter duty cycle than each of the activation pulses of the first set.

11. The control circuit of claim 1, wherein the timing circuitry is further configured to control timing of a window signal for activating the detection circuit to monitor the current at the MEMS mirror.

12. The control circuit of claim 11, wherein the timing circuitry is configured to activate the detection circuit near the end of an activation pulse to monitor the current at the MEMS mirror.

13. The control circuit of claim 1, wherein the timing circuitry is configured to measure a length of a first activation pulse and, based on the measurement, to adjust a voltage of a subsequent activation pulse.

14. The control circuit of claim 13, wherein the voltage of the subsequent activation pulse is decreased if the length of the first activation pulse is less than a desired length, and wherein the voltage of the subsequent activation pulse is increased if the length of the first activation pulse is greater than the desired length.

15. The control circuit of claim 14, wherein the length of the first activation pulse and the desired length are measured in clock cycles.

16. The control circuit of claim 13, wherein the timing circuitry is further configured to control timing of a window signal for activating the detection circuit to monitor the current at the MEMS mirror, and
    wherein the timing circuitry is configured to compare the measured length of the first activation pulse to a desired length by activating the window signal at the beginning of the first activation pulse and, based on the current detected during the window signal activated at the beginning of the first activation pulse, determining the measured length is less than the desired length if the detected current is a first direction and determining the measured length is greater than the desired length if the detected current is a second direction.

17. A method for controlling operation of a resonance MEMS mirror, the method comprising:
    generating a first set of activation pulses for operating the MEMS mirror;
    generating a window for current detection, the window overlapping with an end of an activation pulse;
    detecting current at the MEMS mirror during the window; and terminating the activation pulse in response to detecting a change in current direction during the window.

18. The method of claim 17, wherein the MEMS mirror is an in-plane MEMS mirror.

19. The method of claim 17, wherein the MEMS mirror is a staggered MEMS mirror.

20. The method of claim 17, wherein generating the first set of activation pulses includes applying a first primary pulse to a first portion of the MEMS mirror and applying a second primary pulse to a second portion of the MEMS mirror.

21. The method of claim 20, wherein the first primary pulse commences when an angle of the MEMS mirror is at its greatest positive value and terminates at an angle of maximum capacitance for the first portion of the MEMS mirror, and wherein the second primary pulse commences when the angle of the MEMS mirror is at its greatest negative value and terminates at an angle of maximum capacitance for the second portion of the MEMS mirror.

22. The method of claim 17, further comprising generating a second set of activation pulses for operating the MEMS mirror.

23. The method of claim 22, wherein generating the second set of activation pulses includes applying a first secondary pulse to a first portion of the MEMS mirror and applying a second secondary pulse to a second portion of the MEMS mirror.

24. The method of claim 23, wherein the first secondary pulse commences when an angle of the MEMS mirror is at its greatest negative value and terminates at an angle of maximum capacitance for the first portion of the MEMS mirror, and wherein the second secondary pulse commences when the angle of the MEMS mirror is at its greatest positive value and terminates at an angle of maximum capacitance for the second portion of the MEMS mirror.

25. The method of claim 17, further comprising measuring a length of a first activation pulse and, based on the measurement, adjusting a voltage of a subsequent activation pulse.

26. The method of claim 25, further comprising:
decreasing the voltage of the subsequent activation pulse if the length of the first activation pulse is less than a desired length; and
increasing the voltage of the subsequent activation pulse if the length of the first activation pulse is greater than the desired length.

27. The method of claim 25, further comprising comparing the measured length of the first activation pulse to a desired length.

28. The method of claim 27, wherein the comparison includes:
activating the window at the beginning of the first activation pulse,
detecting the current during the window activated at the beginning of the first activation pulse,
determining the measured length is less than the desired length if the detected current is a first direction, and
determining the measured length is greater than the desired length if the detected current is a second direction.

29. The method of claim 27, wherein the length of the first activation pulse and the desired length are measured in clock cycles.

* * * * *